United States Patent
Hashimoto

(10) Patent No.: US 6,680,234 B2
(45) Date of Patent: Jan. 20, 2004

(54) SEMICONDUCTOR DEVICE HAVING THE EFFECT THAT THE DROP IN THE CURRENT GAIN IS KEPT TO THE MINIMUM, WHEN THE SUBSTRATE DENSITY IS AMPLIFIED AND THAT THE VARIATION IN THE COLLECTOR CURRENT IS IMPROVED

(75) Inventor: Takasuke Hashimoto, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/230,095

(22) Filed: Aug. 29, 2002

(65) Prior Publication Data

US 2003/0001235 A1 Jan. 2, 2003

Related U.S. Application Data

(62) Division of application No. 09/864,330, filed on May 25, 2001.

(30) Foreign Application Priority Data

May 29, 2000 (JP) .......................... 2000-158711

(51) Int. Cl.$^7$ .................... H01L 21/311; H01L 21/00
(52) U.S. Cl. .................... 438/309; 438/312; 438/341; 438/350; 438/933
(58) Field of Search ............... 438/309, 312, 438/350, 341, 933; 257/198, 591, 592, 593, 616

(56) References Cited

U.S. PATENT DOCUMENTS

| | | | | |
|---|---|---|---|---|
| 5,225,371 A | * | 7/1993 | Sexton et al. | 117/43 |
| 5,250,448 A | * | 10/1993 | Hamasaki et al. | 438/312 |
| 5,323,032 A | * | 6/1994 | Sato et al. | 257/198 |
| 5,440,152 A | | 8/1995 | Yamazaki | |
| 5,523,606 A | * | 6/1996 | Yamazaki | 257/370 |
| 5,569,611 A | * | 10/1996 | Imai | 438/350 |
| 5,766,999 A | * | 6/1998 | Sato | 438/309 |
| 5,962,880 A | | 10/1999 | Oda et al. | |
| 6,388,307 B1 | * | 5/2002 | Kondo et al. | 257/592 |
| 2002/0024061 A1 | * | 2/2002 | Kondo et al. | 257/198 |
| 2002/0038874 A1 | * | 4/2002 | Egashira | 257/197 |
| 2002/0061627 A1 | * | 5/2002 | Kovacic | 438/309 |

FOREIGN PATENT DOCUMENTS

| | | |
|---|---|---|
| JP | 07-044185 | 5/1995 |
| JP | 07-147287 | 6/1995 |
| JP | 10-079394 | 3/1998 |
| JP | 11-214399 | 8/1999 |
| JP | 2000-31162 | 1/2000 |

* cited by examiner

Primary Examiner—Michael S. Lebentritt
(74) Attorney, Agent, or Firm—Foley & Lardner

(57) ABSTRACT

A semiconductor device includes a SiGe base bipolar transistor. The SiGe base bipolar transistor includes an emitter layer, a collector layer and a SiGe base layer formed of silicon containing germanium. A Ge concentration of the SiGe base layer is increased from 0% to 10% from a side of the emitter layer towards a side of the collector layer.

12 Claims, 7 Drawing Sheets

SEMICONDUCTOR DEVICE HAVING THE EFFECT THAT THE DROP IN THE CURRENT GAIN IS KEPT TO THE MINIMUM, WHEN THE SUBSTRATE DENSITY IS AMPLIFIED AND THAT THE VARIATION IN THE COLLECTOR CURRENT IS IMPROVED

CROSS-REFERENCE TO RELATED PATENT APPLICATIONS

This application is a division of application Ser. No. 09/864,330, filed May 25, 2001, now pending, and based on Japanese Patent Application No. 2000-158711, filed May 29, 2000, by Takasuke Hashimoto. This application claims only subject matter disclosed in the parent application and therefore presents no new matter.

BACKGROUND OF THE INVENTION

1. Field of the Invention

The present invention relates to a semiconductor device and a semiconductor manufacturing method. More particularly, the present invention relates to a semiconductor device and a semiconductor manufacturing method, which can minimize a drop in a current gain at a time of an increase in a collector current density and also improve a variation in a collector current.

2. Description of the Related Art

As a conventional technique, for example, there is a technique disclosed in Japanese Laid Open Patent Application (JP-A-Heisei, 7-147287). That is, this is a SiGe base bipolar transistor, in which each of a base layer and a collector layer are constituted by a single crystal silicon layer containing germanium (Element Symbol: Ge), and an occurrence of a parasitic energy barrier is protected in a base-collector junction region, and a drop in a cut-off frequency is suppressed.

FIG. 1 is a device section view describing a conventional SiGe base bipolar transistor. In FIG. 1, a symbol 201 denotes a P-type silicon substrate. A symbol 202 denotes an N⁺-type buried layer. A symbol 203A denotes a first collector layer. A symbol 203B denotes a second collector layer. A symbol 205 denotes an insulation separation oxide film. A symbol 206 denotes a diffusion layer to pull out a collector. A symbol 207 denotes an oxide film. A symbol 208 denotes a P-type poly-crystal silicon layer to pull out an outer base. A symbol 209 denotes a silicon nitride film. A symbol 210 denotes a P-type SiGe base layer (silicon germanium base layer). A symbol 211 denotes a silicon nitride film. A symbol 212 denotes a poly-crystal silicon film to pull out an emitter. And, a symbol 213 denotes an emitter layer.

In the conventional SiGe base bipolar transistor, the N⁺-type buried layer 202 having a high concentration and the first collector layer 203A having a first Ge concentration distribution and the second collector layer 203B having a second Ge concentration distribution are formed on the P-type silicon substrate 201, as shown in FIG. 1. The P-type SiGe base layer 210 resulting from a selectively epitaxial growth and the emitter layer 213 constituted by an N-type diffusion layer are formed on the first collector layer 203A.

FIG. 2 is a graph showing the profile of a Ge percentage content (germanium percent content) and an impurity concentration with respect to a depth of the conventional SiGe base bipolar transistor. In the conventional SiGe base bipolar transistor, the first collector layer 203A having the first Ge concentration distribution and the second collector layer 203B having the second Ge concentration distribution (germanium concentration distribution) are formed in the N⁺-type buried layer 202 having the high concentration in which N-type impurity is doped at about $10^{20}$ cm$^{-3}$, as shown in FIG. 2. Then, the P-type SiGe base layer 210 in which P-type impurity is doped at about $5 \times 10^{18}$ cm$^{-3}$ and the poly-crystal silicon film 212 to pull out an emitter in which the N-type impurity is doped at about $2 \times 10^{20}$ cm$^{-3}$ are formed on the first collector layer 203A. The emitter layer 213 is formed by using the impurity thermal diffusion from the poly-crystal silicon film 212 to pull out an emitter in which the N-type impurity is doped.

With regard to the Ge concentration distribution of the P-type SiGe base layer 210, in the P-type SiGe base layer 210, an emitter region side has a low distribution, and a collector region side has a high distribution. That is, the emitter region side has a Ge percentage content of 0%, and the collector region side has a slant concentration distribution having a percentage content of 10%. FIG. 3 shows an energy band structure at this time.

FIG. 3 is a graph showing an energy band at the slant Ge profile (slant germanium profile). As shown in FIG. 3, in the case of the conventional SiGe base bipolar transistor, in the P-type crystal SiGe base layer 210, an inclination can be set for a conductive band side of an energy band, correspondingly to a Ge composition ratio (germanium composition ratio). Thus, an electron implanted from an emitter is accelerated in the P-type SiGe base layer 210 by an electrical field caused by the slant energy band structure. Hence, it is possible to reduce a base transit time of the electron and accordingly improve a cut-off frequency $f_T$.

However, in the case of the conventional SiGe base bipolar transistor, in order to make the cut-off frequency $f_T$ higher by using the slant Ge profile, it is necessary to reduce a thickness of the P-type SiGe base layer 210. For example, it is noted that the thickness of the P-type SiGe base layer 210 is about 90 nm and the cut-off frequency $f_T$=20 GHz. In order to set the cut-off frequency $f_T$ to 60 GHz, the thickness of the P-type SiGe base layer 210 must be reduced to about 30 nm. This brings about the following problems.

As the first problem, a constant region is narrow because of a drop in a current gain $h_{FE}$ in a high current region when the slant Ge profile is used, although an analog circuit especially requires that a current gain $h_{FE}$ (=collector current/base current) is constant in a wide current region of a collector current.

The reason is as follows. In the profile that the impurity concentration in the base is constant and the Ge concentration is slant such as the slant Ge profile, a collector current density Jc is represented by the following equation (1):

$$Jc = \frac{qDn\,ni^2}{NA\,Wb} \frac{\Delta EgGe(\text{grade})}{kT} \exp\left[\frac{\Delta EgGe(0)}{kT}\right] \quad \text{equation (1)}$$

$\Delta EgGe(0)$: Contraction Amount of Band Gap by Ge at Tip of Depletion Layer between Emitter And Base
$\Delta EgGe(\text{grade})$: Ge Slant Amount in Neutral Base
Dn: Diffusion Constant of Electron in Base
NA: Base Impurity Concentration
Wb: Base Width
ni: Intrinsic Carrier Density
q: Charge In the case of the slant Ge profile of the conventional SiGe base bipolar transistor, when the thickness of the P-type SiGe base layer 210 is reduced, this reduction causes the Ge inclinations (germanium inclinations) to be sharp at the positions of the formations of the emitter-base junction and the depletion layer between the emitter and the base. This results in a large reduction in a contraction amount $^\Delta E_{g,Ge}(0)$ of a band gap when the depletion layer between the emitter and the base is contracted as a voltage between the emitter and the base is made higher. Thus, the collector current is dropped in accordance with the equation (1), and the current gain $h_{FE}$ is largely dropped.

The second problem is the occurrence of a large variation in a collector current flowing when a certain voltage is applied between the base and the emitter. The variation in the collector current has great influence on a circuit operation when a transistor is used as a constant current source, for example, such as a case of an ECL circuit.

The reason of the variation in this collector current is as follows. The emitter layer 213 is formed by using the impurity thermal diffusion from the poly-crystal silicon film 212 to pull out an emitter in which the N-type impurity is doped. The reduction in the thickness of the P-type SiGe base layer 210 causes the Ge inclination (germanium inclination) to be sharp at the position where the emitter-base junction is formed. As a result, the slight variation at the junction position leads to the difference of the contraction amount $^{\Delta E}_{g,Ge}(0)$ in the band gap. That is, the collector current is proportional to the contraction amount $^\Delta E_{g,Ge}(0)$ in the band gap as an exponential function, which brings about the large variation in the collector current.

Japanese Laid Open Patent Application (JP-A-2000-31162) discloses the following hetero junction bipolar transistor. The hetero junction bipolar transistor is provided with: a collector layer constituted by a semiconductor containing a first conductive type impurity; a base layer that is provided adjacently to the collector layer and constituted by a compound crystal semiconductor containing a second conductive type impurity; and an emitter layer that is provided opposite to the collector layer with the base layer between and constituted by the semiconductor containing the first conductive type impurity. The base layer is provided such that a band gap of the compound semiconductor is gradually reduced from the emitter side towards the collector side and a concentration of the second conductive type impurity is gradually reduced from the emitter side towards the collector side.

Japanese Laid Open Patent Application (JP-A-Heisei, 11-214399) discloses the following bipolar semiconductor device. The bipolar semiconductor device is provided with: a semiconductor layer having a first conductive type of a buried layer so as to form a collector region, on a substrate; a first insulation film formed on the semiconductor layer; a second conductive type of a first conductive film similarly formed on the semiconductor layer so as to form a base region, a second conductive type of a second conductive film which is formed on the first insulation film and connected to the first conductive film so as to form a base pull-out electrode; and a first conductive type of a third conductive film which is separated through a second insulation film from the second conductive film and formed on the first conductive film so as to form an emitter region, wherein the first insulation film and the second conductive film are coated with glass material insulation film, and the surface of the glass material insulation film is flat.

Japanese Laid Open Patent Application (JP-A-Heisei, 10-79394) discloses the following bipolar transistor. The bipolar transistor at least contains: a first conductive type of a single crystal silicon layer; a many-layer film composed of a first insulation film having an opening provided on a surface of the first conductive type of the single crystal silicon layer, a second conductive type of a poly-crystal layer of a conductive type opposite to the first conductive type, and a second insulation film; a first conductive type of a single crystal silicon germanium layer provided in the opening; a second conductive type of a single crystal silicon germanium layer provided on the first conductive type of the single crystal silicon germanium layer; and a second conductive type of a poly-crystal silicon germanium layer placed in contact with both the second conductive type of the single crystal silicon germanium layer and the second conductive type of the poly-crystal layer.

Moreover, Japanese Publication Patent Application (JP-B2-Heisei, 07-44185) discloses the following semiconductor device. The semiconductor device is a bipolar transistor, in which on a silicon substrate or a silicon epitaxial layer having a first conductive type, has a compound crystal layer composed of silicon and germanium, and has a second conductive type impurity layer in the compound crystal, and has a silicon layer having a first conductive type impurity on the compound crystal layer of the silicon and the germanium, and has a hetero junction in a manner of forming a p-n junction on a boundary between the compound crystal layer of the silicon and the germanium and the silicon layer, wherein it is formed on the silicon substrate or the silicon epitaxial layer so that a germanium concentration included in the compound crystal composed of the silicon and the germanium is gradually higher towards the boundary between an outer compound crystal layer and the silicon layer thereon.

SUMMARY OF THE INVENTION

The present invention is accomplished in view of the above mentioned problems. Therefore, an object of the present invention is to provide a semiconductor device and a semiconductor manufacturing method, which can minimize a drop in a current gain at a time of an increase in a collector current density and also improve a variation in a collector current.

In order to achieve an aspect of the present invention, a semiconductor device, includes: a SiGe base bipolar transistor; and wherein the SiGe base bipolar transistor includes: an emitter layer; a collector layer; and a SiGe base layer formed of silicon containing germanium, and wherein a Ge concentration of the SiGe base layer is increased from 0% to 10% from a side of the emitter layer towards a side of the collector layer.

In this case, the SiGe base bipolar transistor includes: a P-type silicon substrate; and an N$^+$-type buried layer having a high concentration formed in the P-type silicon substrate, and wherein the collector layer is formed of an N-type having a low concentration and is formed on the N$^+$-type buried layer, and wherein the SiGe base bipolar transistor further including: an undoped SiGe layer in which an impurity is not doped, the undoped SiGe layer being formed on the N-type collector layer; a first SiGe base layer as a part of the SiGe base layer having a first Ge concentration distribution formed on the undoped SiGe layer; and a second SiGe base layer as another part of the SiGe base layer having a second Ge concentration distribution formed on the first SiGe base layer, and wherein the emitter layer is formed of an N-type diffusion layer formed in the second SiGe base layer.

In this case, an N-type impurity is doped at about $10^{16}$ cm$^{-3}$ as the low concentration of the N-type collector layer, and the N-type impurity is doped at about $10^{20}$ cm$^{-3}$ as the high concentration of the N$^+$-type buried layer.

Also in this case, the undoped SiGe layer has a Ge concentration of about 10% and a thickness of about 30 nm.

Further in this case, a P-type impurity is doped at about $1\times10^{19}$ cm$^{-3}$ in the first SiGe base layer and the second SiGe base layer.

Further in this case, the semiconductor device further includes: a poly-crystal silicon film to pull out an emitter in which an N-type impurity is doped at about $2\times10^{20}$ cm$^{-3}$, the poly-crystal silicon film being formed on the second SiGe base layer.

In this case, the emitter layer is formed as a result that an impurity thermal diffusion is performed on the poly-crystal silicon film.

Also in this case, the SiGe base layer includes a first SiGe base layer and a second SiGe base layer, and wherein a thickness of the second SiGe base layer is about 20 nm, and a Ge concentration in the second SiGe base layer is increased from about 0% to about 2% from the side of the emitter layer towards the side of the collector layer, and wherein a thickness of the first SiGe base layer is about 10 nm, and a Ge concentration in the first SiGe base layer is increased from about 2% to about 10% from the side of the emitter layer towards the side of the collector layer.

Further in this case, the SiGe base bipolar transistor including: a P-type silicon substrate; and an N$^+$-type buried layer having a high concentration in which an N-type impurity is doped at about $10^{20}$ cm$^{-3}$ formed in the P-type silicon substrate, and wherein the collector layer is formed of an N-type having a low concentration in which the N-type impurity is doped at about $10^{16}$ cm$^{-3}$ and is formed on the N$^+$-type buried layer, and wherein the SiGe base bipolar transistor further including: an undoped SiGe layer in which an impurity is not doped, wherein the undoped SiGe layer is formed on the N-type collector layer and has a Ge concentration of about 10% and a thickness of about 30 nm; a third SiGe base layer as a part of the SiGe base layer having a third Ge concentration distribution formed on the undoped SiGe layer; a fourth SiGe base layer as another part of the SiGe base layer having a fourth Ge concentration distribution formed on the third SiGe base layer; and a Si base layer as other part of the SiGe base layer.

In this case, a P-type impurity is doped at about $1\times10^{19}$ cm$^{-3}$ in the third SiGe base layer, the fourth SiGe base layer and the Si base layer.

Also in this case, the semiconductor device further includes: a poly-crystal silicon film to pull out an emitter in which an N-type impurity is doped at about $2\times10^{20}$ cm$^{-3}$, the poly-crystal silicon film being formed on the Si base layer.

Further in this case, the emitter layer is formed as a result that an impurity thermal diffusion is performed on the poly-crystal silicon film.

In this case, the SiGe base layer includes a third SiGe base layer and a fourth SiGe base layer, and a Si base layer, and wherein a thickness of the Si base layer is about 20 nm, and wherein a thickness of the fourth SiGe base layer is about 5 nm, and a Ge concentration in the fourth SiGe base layer is increased from about 0% to about 2% from the side of the emitter layer towards the side of the collector layer, and wherein a thickness of the third SiGe base layer is about 5 nm, and a Ge concentration in the third SiGe base layer is increased from about 2% to about 10% from the side of the emitter layer towards the side of the collector layer.

In order to achieve another aspect of the present invention, a semiconductor with a SiGe base bipolar transistor manufacturing method, includes: (a) providing an emitter layer; (b) providing a collector layer; and (c) providing a SiGe base layer formed of silicon containing germanium, and wherein a Ge concentration of the SiGe base layer is increased from 0% to 10% from a side of the emitter layer towards a side of the collector layer.

Also in this case, the semiconductor with a SiGe base bipolar transistor manufacturing method further includes: (d) providing a P-type silicon substrate; and (e) forming an N$^+$-type buried layer having a high concentration in the P-type silicon substrate, and wherein the collector layer is formed of an N-type having a low concentration and is formed on the N$^+$-type buried layer, and wherein the semiconductor with the SiGe base bipolar transistor manufacturing method further including: (f) forming an undoped SiGe layer in which an impurity is not doped on the N-type collector layer; (g) forming a first SiGe base layer as a part of the SiGe base layer having a first Ge concentration distribution on the undoped SiGe layer; and (h) forming a second SiGe base layer as another part of the SiGe base layer having a second Ge concentration distribution on the first SiGe base layer, and wherein the emitter layer is formed of an N-type diffusion layer formed in the second SiGe base layer.

In this case, an N-type impurity is doped at about $10^{16}$ cm$^{-3}$ as the low concentration of the N-type collector layer, and the N-type impurity is doped at about $10^{20}$ cm$^{-3}$ as the high concentration of the N$^+$-type buried layer.

Also in this case, the undoped SiGe layer has a Ge concentration of about 10% and a thickness of about 30 nm.

Further in this case, a P-type impurity is doped at about $1\times10^{19}$ cm$^{-3}$ in the first SiGe base layer and the second SiGe base layer.

In this case, the semiconductor with a SiGe base bipolar transistor manufacturing method further includes: (i) forming a poly-crystal silicon film to pull out an emitter in which an N-type impurity is doped at about $2\times10^{20}$ cm$^{-3}$ on the second SiGe base layer.

Also in this case, the emitter layer is formed as a result that an impurity thermal diffusion is performed on the poly-crystal silicon film.

Further in this case, the SiGe base layer includes a first SiGe base layer and a second SiGe base layer, and wherein a thickness of the second SiGe base layer is about 20 nm, and a Ge concentration in the second SiGe base layer is increased from about 0% to about 2% from the side of the emitter layer towards the side of the collector layer, and wherein a thickness of the first SiGe base layer is about 10 nm, and a Ge concentration in the first SiGe base layer is increased from about 2% to about 10% from the side of the emitter layer towards the side of the collector layer.

In this case, the semiconductor with a SiGe base bipolar transistor manufacturing method further includes: (j) providing a P-type silicon substrate; and (k) forming an N$^+$-type buried layer having a high concentration in which an N-type impurity is doped at about $10^{20}$ cm$^{-3}$ in the P-type silicon substrate, and wherein the collector layer is formed of an N-type having a low concentration in which the N-type impurity is doped at about $10^{16}$ cm$^{-3}$ and is formed on the N$^+$-type buried layer, and wherein the semiconductor with the SiGe base bipolar transistor manufacturing method further including: (l) forming an undoped SiGe layer in which an impurity is not doped on the N-type collector layer, the undoped SiGe layer having a Ge concentration of about 10% and a thickness of about 30 nm; (m) forming a third SiGe base layer as a part of the SiGe base layer having a third Ge concentration distribution on the undoped SiGe layer; (n) forming a fourth SiGe base layer as another part of the SiGe base layer having a fourth Ge concentration distribution on the third SiGe base layer; and (o) forming a Si base layer as other part of the SiGe base layer.

Also in this case, a P-type impurity is doped at about $1\times10^{19}$ cm$^{-3}$ in the third SiGe base layer, the fourth SiGe base layer and the Si base layer.

Further in this case, the semiconductor with a SiGe base bipolar transistor manufacturing method, further includes: (p) forming a poly-crystal silicon film to pull out an emitter in which an N-type impurity is doped at about $2\times10^{20}$ cm$^{-3}$ on the Si base layer.

In this case, the emitter layer is formed as a result that an impurity thermal diffusion is performed on the poly-crystal silicon film.

Also in this case, the SiGe base layer includes a third SiGe base layer and a fourth SiGe base layer, and a Si base layer, and wherein a thickness of the Si base layer is about 20 nm, and wherein a thickness of the fourth SiGe base layer is about 5 nm, and a Ge concentration in the fourth SiGe base layer is increased from about 0% to about 2% from the side of the emitter layer towards the side of the collector layer, and wherein a thickness of the third SiGe base layer is about 5 nm, and a Ge concentration in the third SiGe base layer is increased from about 2% to about 10% from the side of the emitter layer towards the side of the collector layer.

The purpose of the present invention characteristically lies in a semiconductor device containing a SiGe base bipolar transistor having a slant Ge profile in which a Ge concentration of a SiGe base layer is increased from 0% to 10% from an emitter region side towards a collector region side.

In this case, an N$^+$-type buried layer having a high concentration and an N-type collector layer having a low concentration are formed on a P-type silicon substrate of the SiGe base bipolar transistor, and an undoped SiGe layer in which an impurity is not doped, a first SiGe base layer having a first Ge concentration distribution and a second SiGe base layer having a second Ge concentration distribution are formed on the N-type collector layer having the low concentration, and an emitter layer made of an N-type diffusion layer is formed on the second SiGe base layer.

Also in this case, the SiGe base bipolar transistor is formed such that the N-type collector layer having the low concentration in which an N-type impurity is doped at about $10^{16}$ cm$^{-3}$ is formed on the N$^+$-type buried layer having the high concentration in which the N-type impurity is doped at about $10^{20}$ cm$^{-3}$.

Further in this case, the SiGe base bipolar transistor is formed such that the undoped SiGe layer having a Ge concentration of about 10% and a thickness of about 30 nm, the first SiGe base layer having a first Ge concentration distribution and the second SiGe base layer having a second Ge concentration distribution are formed on the N-type collector layer having the low concentration.

In this case, the SiGe base bipolar transistor is formed such that the P-type impurity is doped at about $1\times10^{19}$ cm$^{-3}$ in the first SiGe base layer and the second SiGe base layer.

Also in this case, the SiGe base bipolar transistor is formed such that a poly-crystal silicon film to pull out an emitter in which the N-type impurity is doped at about $2\times10^{20}$ cm$^{-3}$ is formed on the second SiGe base layer.

Further in this case, the emitter layer of the SiGe base bipolar transistor is formed by using the impurity thermal diffusion from the poly-crystal silicon film to pull out the emitter in which the N-type impurity is doped.

In this case, the SiGe base bipolar transistor is designed such that a thickness of the second SiGe base layer is about 20 nm, a Ge concentration is increased from about 0% to about 2% from the emitter region side towards the collector region side in the second SiGe base layer, a thickness of the first SiGe base layer is about 10 nm, and a Ge concentration in the first SiGe base layer is increased from about 2% to about 10%.

Also in this case, the SiGe base bipolar transistor is formed such that the N-type collector layer of the low concentration in which the N-type impurity is doped at about $10^{16}$ cm$^{-3}$ on the N$^+$-type buried layer having the high concentration in which the N-type impurity is doped at about $10^{20}$ cm$^{-3}$, and the undoped SiGe layer having a Ge concentration of about 10% and a thickness of about 30 nm, a third SiGe base layer having a third Ge concentration distribution, a fourth SiGe base layer having a fourth Ge concentration distribution, and a Si base layer are formed on the N-type collector layer having the low concentration.

Further in this case, the SiGe base bipolar transistor is formed by the formation of a poly-crystal silicon film to pull out an emitter, in which the P-type impurity is doped at about $1\times10^{19}$ cm$^{-3}$ on the third SiGe base layer, the fourth SiGe base layer and the Si base layer, and the N-type impurity is doped at about $2\times10^{20}$ cm$^{-3}$ on the Si base layer.

In this case, the emitter layer of the SiGe base bipolar transistor is formed by using the impurity thermal diffusion from the poly-crystal silicon film to pull out the emitter in which the N-type impurity is doped.

Also in this case, the SiGe base bipolar transistor is designed such that a thickness of the Si base layer is about 20 nm, a thickness of the fourth SiGe base layer is about 5 nm, a Ge concentration is increased from about 0% to about 2% from the emitter region side in the fourth SiGe base layer, a thickness of the third SiGe base layer is about 5 nm, and a Ge concentration in the third SiGe base layer is increased from about 2% to about 10%.

The semiconductor manufacturing method has a step of forming a SiGe base bipolar transistor having a slant Ge profile in which a Ge concentration of a SiGe base layer is increased from 0% to 10% from an emitter region side towards a collector region side.

In this case, the present invention further includes the steps of: forming the N-type collector layer having the low concentration in which the N-type impurity is doped at about $10^{16}$ cm$^{-3}$, on the N$^+$-type buried layer having the high concentration in which the N-type impurity is doped at about $10^{20}$ cm$^{-3}$; forming the undoped SiGe layer having a Ge concentration of about 10% and a thickness of about 30 nm, the first SiGe base layer having a first Ge concentration distribution, and the second SiGe base layer having a second Ge concentration distribution, on the N-type collector layer having the low concentration; doping the P-type impurity at about $1\times10^{19}$ cm$^{-3}$ on the first SiGe base layer and the second SiGe base layer; forming a poly-crystal silicon film to pull out an emitter in which the N-type impurity is doped at $2\times10^{20}$ cm$^{-3}$, on the second SiGe base layer; and setting a thickness of the second SiGe base layer to about 20 nm, increasing the Ge concentration from about 0% to about 2% from an emitter region side towards a collector region side in the second SiGe base layer, setting a thickness of the first SiGe base layer to about 10 nm, and increasing the Ge concentration in the first SiGe base layer from about 2% to about 10%.

The semiconductor manufacturing method further includes the steps of: forming the N-type collector layer having the low concentration in which the N-type impurity is doped at about $10^{16}$ cm$^{-3}$, on the N$^+$-type buried layer having the high concentration in which the N-type impurity is doped at about $10^{20}$ cm$^{-3}$; forming the undoped SiGe layer having a Ge concentration of about 10% and a thickness of about 30 nm, a third SiGe base layer having a third Ge concentration distribution, a fourth SiGe base layer having a fourth Ge concentration distribution and a Si base layer, on the N-type collector layer having the low concentration; doping the P-type impurity at about $1\times10^{19}$ cm$^{-3}$ on the third SiGe base layer, the fourth SiGe base layer and the Si base layer; forming a poly-crystal silicon film to pull out an emitter in which the N-type impurity is doped at $2\times10^{20}$ cm$^{-3}$, on the Si base layer; forming an emitter layer by using the impurity thermal diffusion from the poly-crystal silicon film to pull out the emitter in which the N-type impurity is doped; and setting a thickness of the Si base layer to about 20 nm, setting a thickness of the fourth SiGe base layer to about 5 nm, increasing the Ge concentration from about 0% to about 2% from an emitter region side in the fourth SiGe base layer, and also setting a thickness of the third SiGe base layer to about 5 nm, and then increasing the Ge concentration in the third SiGe base layer from about 2% to about 10%.

DETAILED DESCRIPTION OF THE PREFERRED EMBODIMENTS

An embodiment of an appearance inspection method according to the present invention will be described below with reference to the attached drawings.

Figure 4:
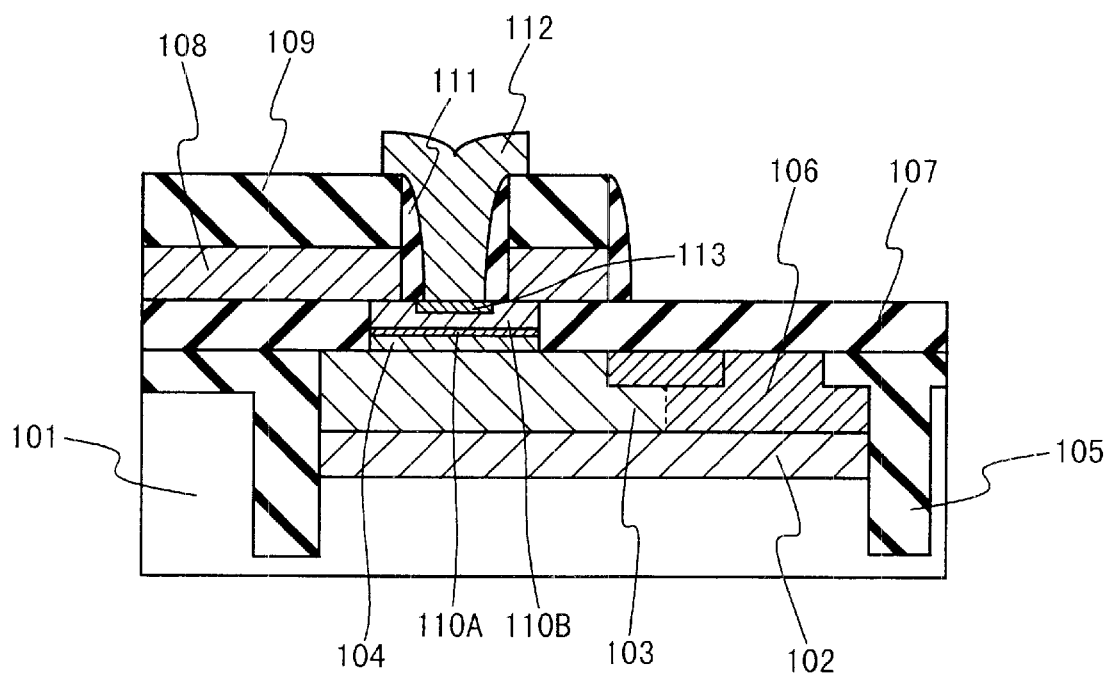
FIG. 4 is a device section view describing a semiconductor device according to a first embodiment of the present invention.

FIG. 4 is a device section view describing a SiGe base bipolar transistor (semiconductor device) according to a first embodiment of the present invention. In FIG. 4, a symbol 101 denotes a P-type silicon substrate. A symbol 102 denotes an N$^+$-type buried layer. A symbol 103 denotes an N-type collector layer. A symbol 104 denotes an undoped SiGe layer. A symbol 105 denotes an insulation separation oxide film. A symbol 106 denotes a diffusion layer to pull out a collector. A symbol 107 denotes an oxide film. A symbol 108 denotes a P-type poly-crystal silicon layer to pull out an outer base. A symbol 109 denotes a silicon nitride film. A symbol 110A denotes a first SiGe base layer. A symbol 110B denotes a second SiGe base layer. A symbol 111 denotes a silicon nitride film. A symbol 112 denotes a poly-crystal silicon film to pull out an emitter. And, a symbol 113 denotes an emitter layer.

In FIG. 4, the N$^+$-type buried layer 102 having a high concentration and the N-type collector layer 103 having a low concentration are formed on the P-type silicon substrate 101. The undoped SiGe layer 104 in which impurity is not doped, the first SiGe base layer 110A having a first Ge concentration distribution, and the second SiGe base layer 110B having a second Ge concentration distribution are formed on the N-type collector layer 103 having the low concentration. And, the emitter layer 113 constituted by an N-type diffusion layer is formed on the second SiGe base layer 110B.

Figure 5:
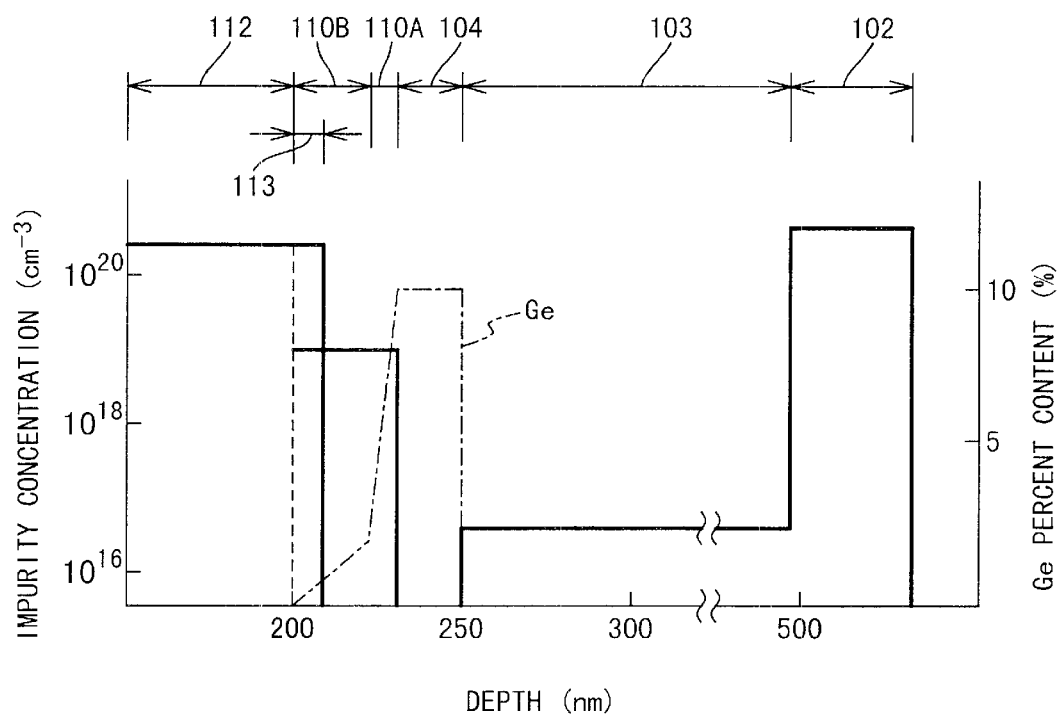
FIG. 5 is a graph showing a slant Ge profile and an impurity concentration with respect to a depth of the semiconductor device according to the first embodiment.

FIG. 5 is a graph showing the profile (slant Ge profile) of a Ge percent content and an impurity concentration with respect to a depth of the SiGe base bipolar transistor (semiconductor device) according to the first embodiment. In this embodiment, the N-type collector layer 103 having the low concentration in which the N-type impurity is doped at about $10^{16}$ cm$^{-3}$ is formed on the N$^+$-type buried layer 102 having the high concentration in which the N-type impurity is doped at about $10^{20}$ cm$^{-3}$. Then, the undoped SiGe layer 104 having a Ge concentration of about 10% and a thickness of about 30 nm, the first SiGe base layer 110A having the first Ge concentration distribution, and the second SiGe base layer 110B having the second Ge concentration distribution are formed on the N-type collector layer 103 having the low concentration. P-type impurity is doped at about $1\times10^{19}$ cm$^{-3}$ on the first SiGe base layer 110A and the second SiGe base layer 110B. Moreover, the poly-crystal silicon film 112 to pull out an emitter in which the N-type impurity is doped at about $2\times10^{20}$ cm$^{-3}$ is formed on the second SiGe base layer 110B. The emitter layer 113 is formed by using the impurity thermal diffusion from the poly-crystal silicon film 112 to pull out the emitter in which the N-type impurity is doped.

The undoped SiGe layer 104 in this embodiment is formed in order to protect a parasitic energy barrier from being induced in a base-collector junction. By the way, as described in the conventional technique disclosed in Japanese Laid Open Patent Application (JP-A-Heisei, 7-147287), the Ge distribution in the collector layer may be designed so as to be sharply reduced on the side of a P-type SiGe base layer 210 and slowly reduced on the side of an N$^+$-type buried layer 202.

Figure 1:
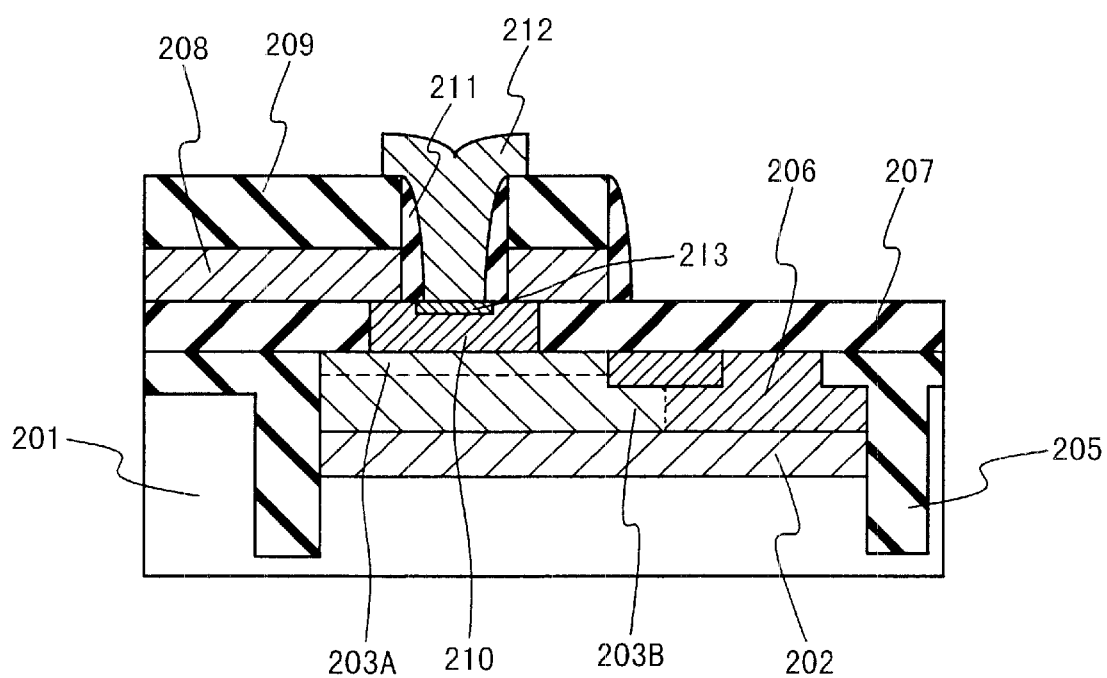
FIG. 1 is a device section view describing a conventional SiGe base bipolar transistor.
Figure 2:
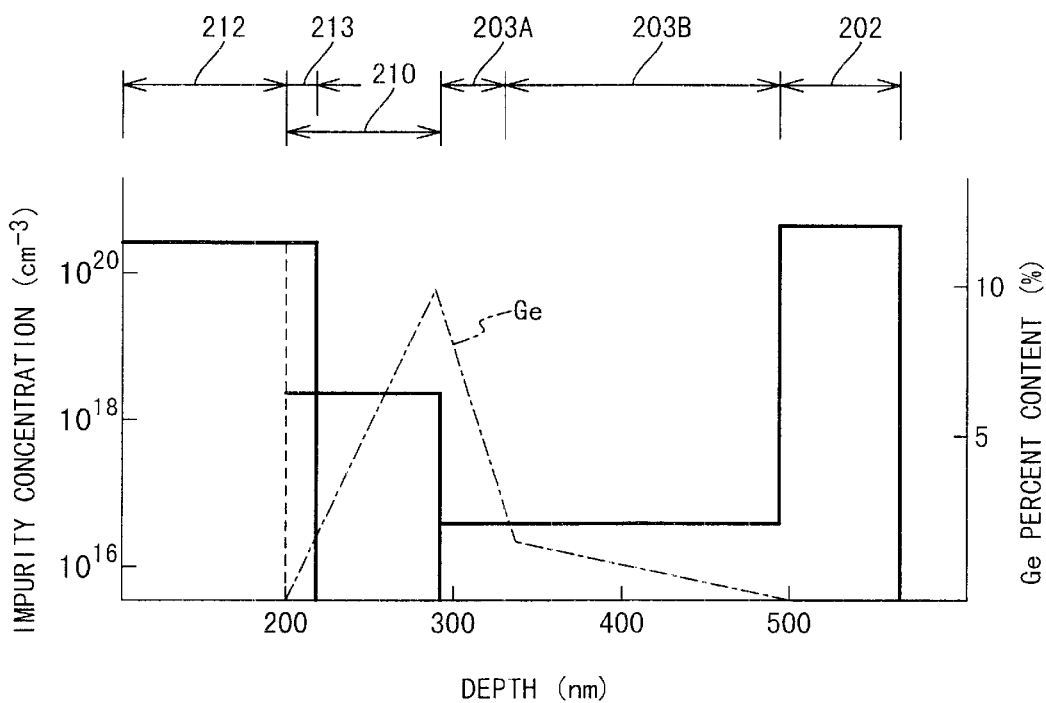
FIG. 2 is a graph showing a slant Ge profile and an impurity concentration with respect to a depth of the conventional SiGe base bipolar transistor.
Figure 3:
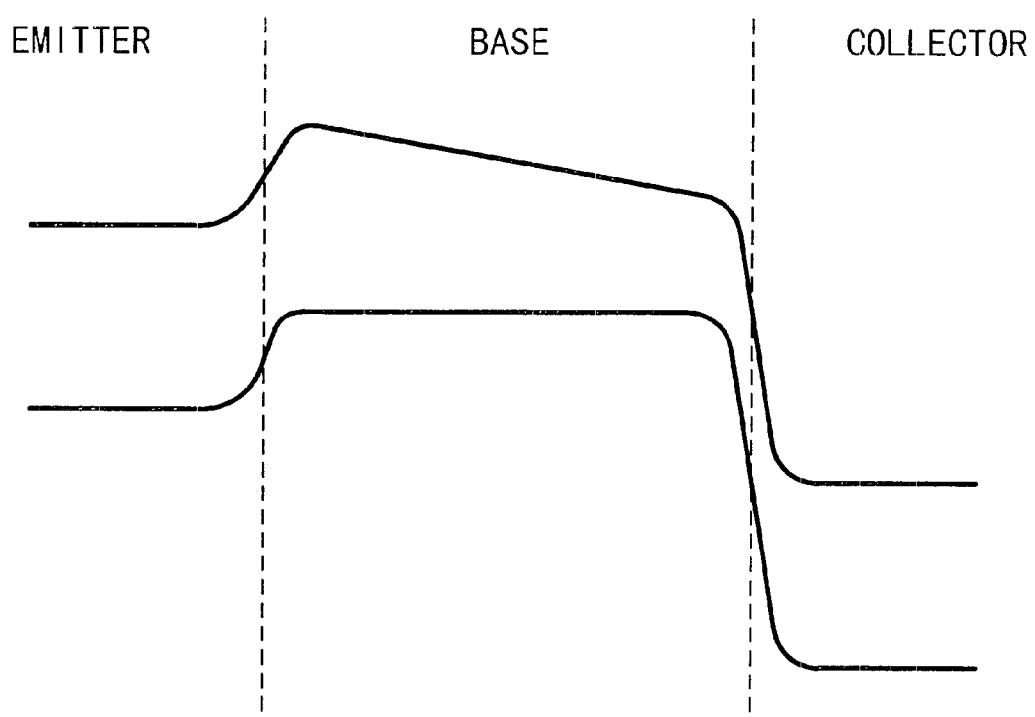
FIG. 3 is a graph showing an energy band at a slant Ge profile.

An embodiment of a semiconductor manufacturing method in the present invention will be described below. As shown in FIG. 2, this is designed such that a thickness of the second SiGe base layer 110B is set at about 20 nm, and a Ge concentration is increased from about 0% to about 2% in the emitter region side of the second SiGe base layer 110B. And, this is designed such that a thickness of the first SiGe base layer 110A is set at about 10 nm, and a Ge concentration is increased from about 2% to about 10% in the first SiGe base layer 110A.

Thus, in the second SiGe base layer 110B in which an emitter-base junction and a depletion layer are formed, a Ge inclination (germanium inclination) can be set at about 0.1%/nm. Hence, a variation amount of a band gap in the depletion layer becomes at an untroubled level, at a time of an increase in a base-emitter voltage.

On the other hand, the total Ge concentration inclination resulting from the first SiGe base layer 110A and the second SiGe base layer 110B is about 10%. Thus, the total of electric fields caused by slant energy band structure can be set to be equal to that of the case when the conventional Ge concentration has a constant inclination. As a result, this provides the effect that the influence on a cut-off frequency $f_T$ can be kept to a minimum.

Figure 6:
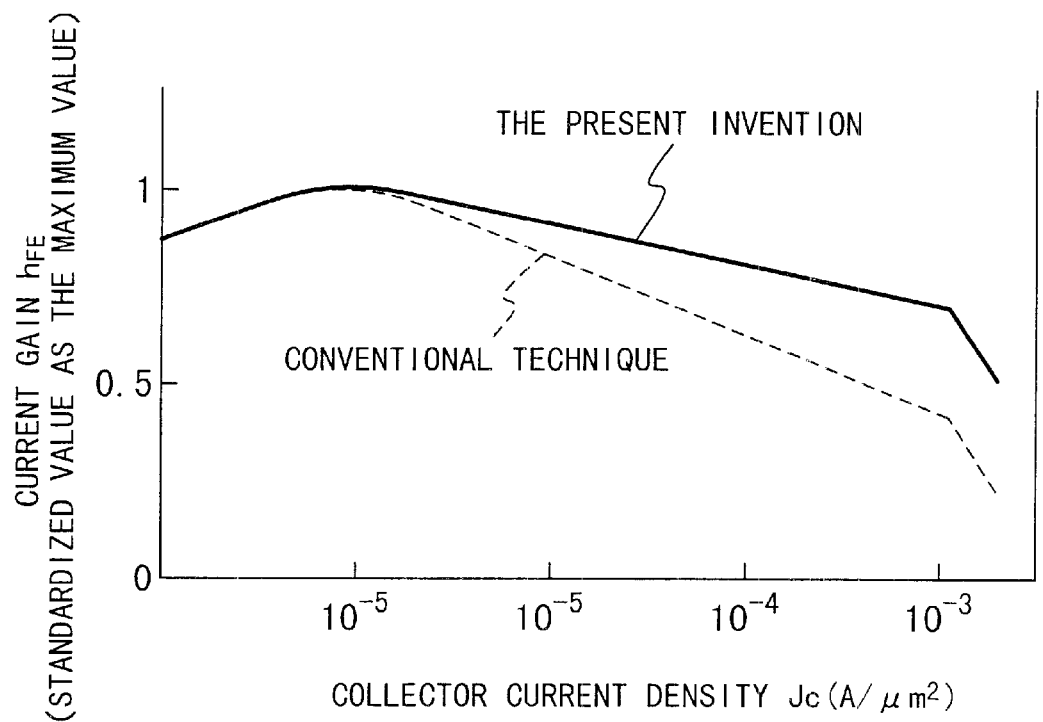
FIG. 6 is a graph describing a change in a current gain with respect to a collector current density.

FIG. 6 is a graph describing a change in a current gain $h_{FE}$ with respect to a collector current density Jc.

In the conventional technique, as the collector current density Jc is higher, the current gain $h_{FE}$ is outstandingly dropped. On the contrary, in this embodiment, the problem of the drop in the current gain $h_{FE}$ is improved as shown in FIG. 6. Actually in this embodiment, the range of the collector current density Jc, in which the current gain $h_{FE}$ is within about 80% with respect to the maximum, can be enlarged by about 20% as compared with that of the conventional technique. Also, the variation in the collector current density Jc can be improved by about 30%.

Second Embodiment

Figure 7:
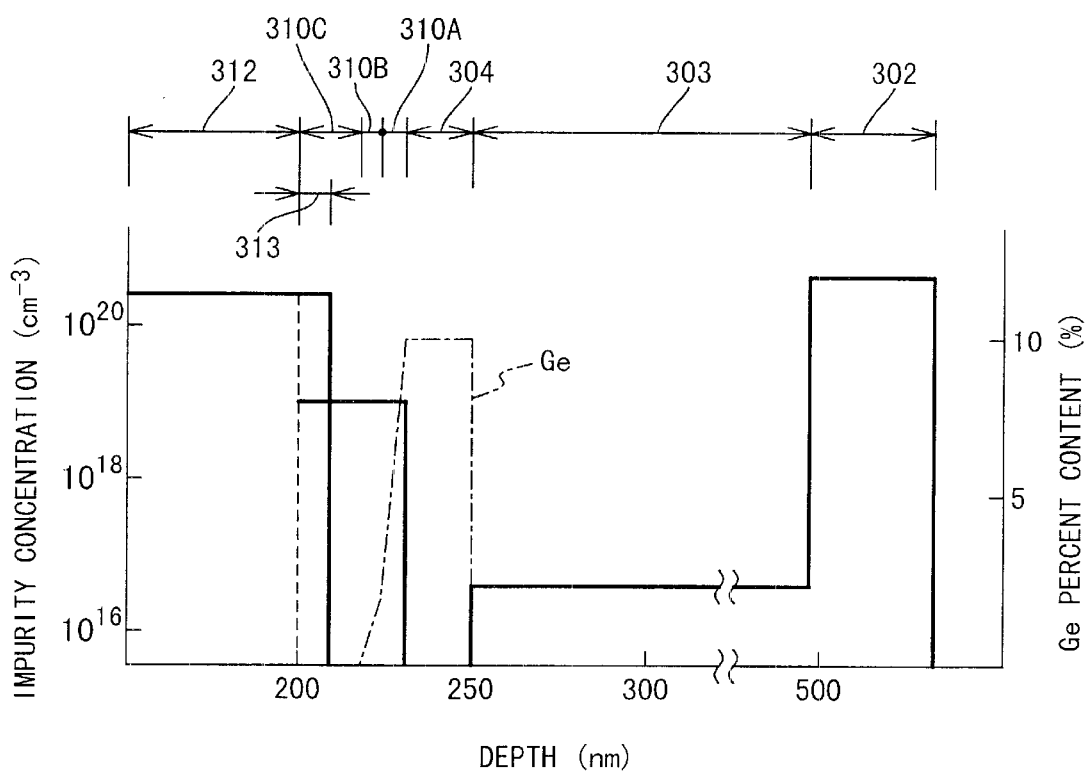
FIG. 7 is a graph showing a slant Ge profile and an impurity concentration with respect to a depth of a semiconductor device according to a second embodiment.

FIG. 7 is a graph showing the profile (slant Ge profile) of a Ge percent content and an impurity concentration with respect to a depth of a SiGe base bipolar transistor (semiconductor device) according to a second embodiment. In FIG. 7, a symbol 302 denotes an $N^+$-type buried layer. A symbol 303 denotes an N-type collector layer. A symbol 304 denotes an undoped SiGe layer. A symbol 310A denotes a third SiGe base layer. A symbol 310B denotes a fourth SiGe base layer. A symbol 310C denotes a Si base layer. A symbol 312 denotes a poly-crystal silicon film to pull out an emitter. And, a symbol 313 denotes an emitter layer.

In the SiGe base bipolar transistor (semiconductor device) according to this embodiment, the N-type collector layer 303 having the low concentration in which the N-type impurity is doped at about $10^{16}$ cm$^{-3}$ is formed on the $N^+$-type buried layer 302 having the high concentration in which the N-type impurity is doped at about $10^{20}$ cm$^{-3}$. Then, the undoped SiGe layer 304 having a Ge concentration of about 10% and a thickness of about 30 nm, the third SiGe base layer 310A having a third Ge concentration distribution, the fourth SiGe base layer 310B having a fourth Ge concentration distribution, and the Si base layer 310C are formed on the N-type collector layer 303 having the low concentration. The P-type impurity is doped at about $1\times10^{19}$ cm$^{-3}$ on the third SiGe base layer 310A, the fourth SiGe base layer 310B and the Si base layer 310C. Moreover, the poly-crystal silicon film 312 to pull out an emitter in which the N-type impurity is doped at about $2\times10^{20}$ cm$^{-3}$ is formed on the Si base layer 310C. The emitter layer 313 is formed by using the impurity thermal diffusion from the poly-crystal silicon film 312 to pull out the emitter in which the N-type impurity is doped.

As shown in FIG. 7, in this embodiment, the thickness of the Si base layer 310C is set at about 20 nm. Then, the thickness of the fourth SiGe base layer 310B is set at about 5 nm, and the Ge concentration is designed so as to be increased from about 0% to about 2% on the emitter region side in the fourth SiGe base layer 310B. Then, the thickness of the third SiGe base layer 310A is set at about 5 nm, and the Ge concentration is designed so as to be increased from about 2% to about 10% in the third SiGe base layer 310A.

In this embodiment, the emitter-base junction and its depletion layer are formed in the Si base layer. Thus, this provides the effect that the variation in the collector current and the linearity of the current gain $h_{FE}$ can be further improved by respectively about 10% as compared with the first embodiment.

By the way, it is obvious that the present invention is not limited to the above-mentioned embodiments and that the above-mentioned embodiments can be suitably modified within the range of the technical principle in the present invention. Also, the numbers, the positions and the shapes of above-mentioned members and the like are not limited to those of the above-mentioned embodiments. They may be the preferable numbers, positions and shapes and the like, respectively. Also, in the respective drawings, the same symbols are given to the same members.

The present invention, since having the above-mentioned configuration, can provide the effect that the drop in the current gain is kept to the minimum, when the substrate density is amplified and that the variation in the collector current is improved.

What is claimed is:

1. A method for manufacturing a semiconductor with a SiGe base bipolar transistor, comprising:
   providing a P-type silicon substrate;
   forming an N-type buried layer having a high concentration in said P-type silicon substrate
   forming a collector layer comprised of an N-type layer having a low concentration on said N-type buried layer;
   forming a SiGe base layer on said collector layer, wherein forming said SiGe base layer comprises:
     forming an undoped SiGe layer on said N-type collector layer;
     forming a first SiGe base layer having a first Ge concentration distribution on said undoped SiGe layer; and
     forming a second SiGe base having a second Ge concentration distribution on said first SiGe base layer; and
   forming an emitter layer comprised of an N-type diffusion layer in said second SiGe base layer,
   wherein a Ge concentration of said SiGe base layer is increased from 0% to 10% from a side of said emitter layer towards a side of said collector layer.

2. The SiGe base bipolar transistor manufacturing method according to claim 1, wherein an N-type impurity is doped at about $10^{16}$ cm$^{-3}$ as said low concentration of said N-type collector layer, and said N-type impurity is doped at about $10^{20}$ cm$^{-3}$ as said high concentration of said N-type buried layer.

3. The SiGe base bipolar transistor manufacturing method according to claim 2, wherein said undoped SiGe layer has a Ge concentration of about 10% and a thickness of about 30 nm.

4. The semiconductor with a SiGe base bipolar transistor manufacturing method according to claim 3, wherein a P-type impurity is doped at about $1 \times 10^{19}$ cm$^{-3}$ in said first SiGe base layer and said second SiGe base layer.

5. The SiGe base bipolar transistor manufacturing method according to claim 4, further comprising:
   forming a poly-crystal silicon film to produce an emitter in which an N-type impurity is doped at about $2 \times 10^{20}$ cm$^{-3}$ on said second SiGe base layer.

6. The SiGe base bipolar transistor manufacturing method according to claim 5, wherein said emitter layer is formed as a result of thermal diffusion of impurity from said poly-crystal silicon film.

7. A method for manufacturing a semiconductor with a SiGe base bipolar transistor, comprising:
   providing an emitter layer;
   providing a collector layer; and
   providing a SiGe base layer formed of silicon containing germanium,
   wherein a Ge concentration of said SiGe base layer is increased from 0% to 10% from a side of said emitter layer towards a side of said collector layer, wherein said SiGe base layer includes a first SiGe base layer and a second SiGe base layer, wherein a thickness of said second SiGe base layer is about 20 nm, and a Ge concentration in said second SiGe base layer is increased from about 0% to about 2% from said side of said emitter layer towards said side of said collector layer, and wherein a thickness of said first SiGe base layer is about 10 nm, and a Ge concentration in said first SiGe base layer is increased from about 2% to about 10% from said side of said emitter layer towards said side of said collector layer.

8. A method for manufacturing a semiconductor with a SiGe base bipolar transistor, comprising:

providing a P-type silicon substrate;

forming an N-type buried layer having a high concentration in which an N-type impurity is doped at about $10^{20}$ cm$^{-3}$ in said P-type silicon substrate;

forming an N-type collector in which said N-type impurity is doped at about $10^{16}$ cm$^{-3}$ and is formed on said N-type buried layer;

forming a SiGe base layer on said collector, wherein forming said SiGe base layer comprises:

forming an undoped SiGe layer on said N-type collector layer, said undoped SiGe layer having a Ge concentration of about 10% and a thickness of about 30 nm;

forming a first SiGe base layer having a first Ge concentration distribution on said undoped SiGe layer;

forming a second SiGe base layer having a second Ge concentration distribution on said first SiGe base layer; and forming a Si base layer on said secod SiGe base layer; and forming an emitter layer, wherein a Ge concentration of said SiGe base layer is increased from 0% to 10% in a direction from said emitter layer towards a side of said collector layer.

9. The SiGe base bipolar transistor manufacturing method according to claim 8, wherein a P-type impurity is doped at about $1\times10^{19}$ cm$^{-3}$ in said first SiGe base layer, said second SiGe base layer and said Si base layer.

10. The SiGe base bipolar transistor manufacturing method according to claim 9, further comprising:

forming a poly-crystal silicon film to produce an emitter in which an N-type impurity is doped at about $2\times10^{20}$ cm$^{-3}$ on said Si base layer.

11. The SiGe base bipolar transistor manufacturing method according to claim 10, wherein said emitter layer is formed by3thermal diffusion of impurity from said poly-crystal silicon film.

12. A method for manufacturing a semiconductor with a SiGe base bipolar transistor, comprising:

providing an emitter layer;

providing a collector layer; and providing a SiGe base layer formed of silicon containing germanium, wherein a Ge concentration of said SiGe base layer is increased from 0% to 10% from a side of said emitter layer towards a side of said collector layer, wherein said SiGe base layer includes a first SiGe base layer and a second SiGe base layer, and a Si base layer, and wherein a thickness of said Si base layer is about 20 nm, and wherein a thickness of said second SiGe base layer is about 5 nm, and a Ge concentration in said second SiGe base layer is increased from about 0% to about 2% from said side of said emitter layer towards said side of said collector layer, and wherein a thickness of said first SiGe base layer is about 5 nm, and a Ge concentration in said first SiGe base layer is increased from about 2% to about 10% from said side of said emitter layer towards said side of said collector layer.

* * * * *